United States Patent [19]
Lambert

[11] Patent Number: 5,330,613
[45] Date of Patent: Jul. 19, 1994

[54] ELECTRIC CONNECTION METHOD

[76] Inventor: François Lambert, 3 Rue Marcel Doret, 78140 Velizy, France

[21] Appl. No.: 859,326

[22] Filed: Mar. 27, 1992

[30] Foreign Application Priority Data

Mar. 28, 1991 [FR] France .................. 91 04210

[51] Int. Cl.⁵ .................. B44C 1/22; B29C 37/00
[52] U.S. Cl. .................. 156/630; 156/633; 156/655; 156/668; 156/902
[58] Field of Search .............. 156/629, 630, 631, 633, 156/634, 655, 656, 668, 902, 901, 283, 306.6, 306.9, 310; 29/860, 876, 884

[56] References Cited

U.S. PATENT DOCUMENTS 4,540,463  9/1985  Kakuhashi et al. ............ 156/630
4,814,040  3/1989  Ozawa ...................... 156/902 X

*Primary Examiner*—William A. Powell
*Attorney, Agent, or Firm*—Herbert Dubno; Yori Kateslou

[57] ABSTRACT

A method of making an electrical connection includes forming in a pattern a plurality of electrically conductive elements on a first piece, forming another plurality of the electrically conductive elements on a second piece in the pattern, applying a layer of duroplastic resin capable of hardening and becoming conductive upon heating over the pattern of the elements of the first piece, heating the elements of the second piece, and placing the second piece against the resin with the heated electrically conductive elements of the second piece in juxtaposition with the elements of the first piece, thereby bonding the elements of the two pieces with the hardened and electrically conductive portions of the resins therebetween.

8 Claims, 3 Drawing Sheets

ELECTRIC CONNECTION METHOD

FIELD OF THE INVENTION

The present invention concerns the electrical connection of a first piece bearing a set of connection elements to a second piece also bearing a set of connection elements having the same relative disposition as the elements of the first piece. problem is posed, for example, for connecting a flexible ply of electric conductors to a component, such as a liquid crystal display unit, a contactor or a potentiometer, or even for ensuring the connection of a component on a substrate, such as a printed circuit.

BACKGROUND OF THE INVENTION

Most frequently, the soldering technique is used but this method is difficult to implement, indeed impossible when extremely compact pitches or non-weldable materials, such as tin or indium oxide, are used. It is then possible to use an elastomer strip constituted by fine alternate conductive and non-conductive strips but in this case it is impossible to embody connections perpendicular to the strips. It is also possible to carry out an anisotropic glueing with glue which, under pressure, becomes conductive when baked. But this method is extremely delicate and unreliable.

OBJECT OF THE INVENTION

It is therefore an object of the present invention to provide a method for connecting a flexible ply of electric conductors to a component, such as a liquid crystal display unit, a contactor, a potentiometer, and for insuring the connection of a component on a substrate, such as a printed circuit.

SUMMARY OF THE INVENTION

This method according to the invention is characterized in a duroplastic resin deposited on the first piece at the right of its connection elements, this resin becoming conductive once it has hardened. The connection elements of the second piece are heated and the connection elements of the second piece are placed in contact with those of the first piece. The resin located between the two sets of connection elements then hardens and becomes conductive, thus ensuring the connection of these two sets of elements, whereas the resin located at the side of the elements of the first piece is not heated and thus not hardened. As a result it is therefore not conductive and may be easily removed by washing.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
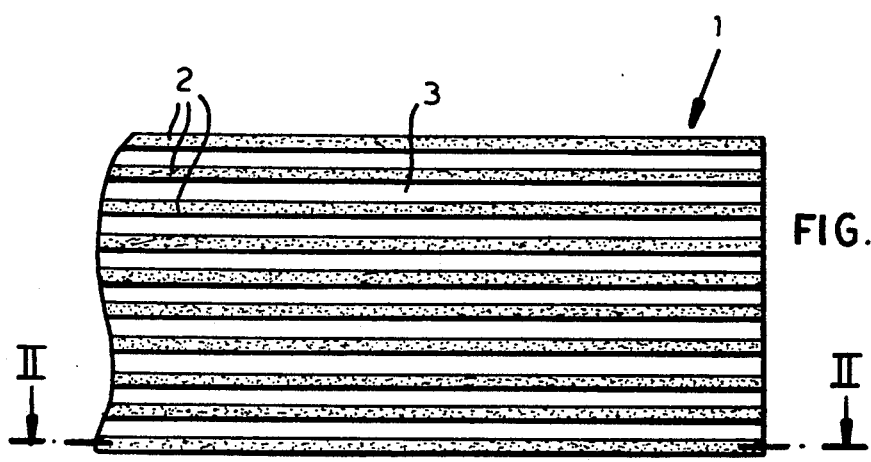
FIG. 1 is a top view of a first piece of an electrical connection according to the invention.
Figure 2:
FIG. 2 is an elevational view of the first piece.
Figure 4:
FIG. 4 is a cross-sectional view of the second piece.
Figure 3:
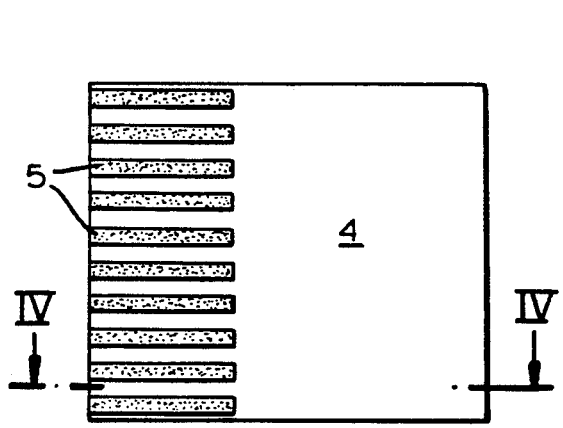
FIG. 3 is a top view of a second piece.
Figure 5:
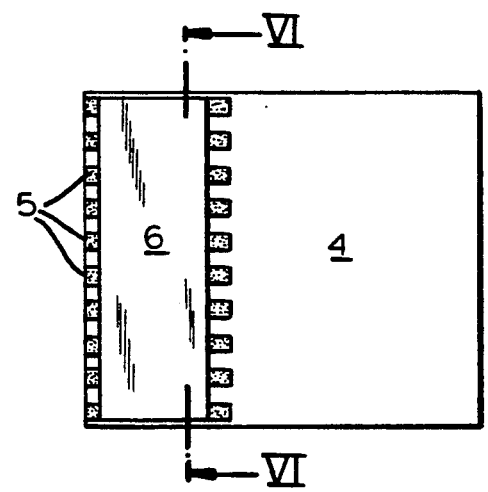
FIG. 5 is a view identical to the one shown in FIG. 4 with a layer of a duroplastic resin.

The following is a description of connecting a flexible circuit 1, which is constituted by parallel metallic strips 2 on a flexible plastic sheet 3 (FIG. 1) made of polyimide or polyester resin, to a component 4 (FIG. 4) bearing parallel conductive connections 5 (FIG. 3) made of metal or of another conductive material, such as tin or indium oxide, with the same pitch as the strips 2.

Figure 6:
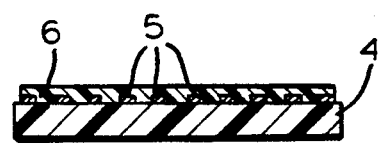
FIG. 6 is a cross-sectional view according to FIG. 5.

By means of serigraphy, stencil or transfer, for example, a duroplastic resin 6 shown in FIG. 6 is deposited on the electric connections 5. The resin, for example, an epoxide resin charged with silver and produced by the EPO-TEK company EPO-TEK company under the name H20E becomes conductive after it has hardened. This type of resin cross-links in about 30 seconds at a temperature of 175° C.

Figure 7:
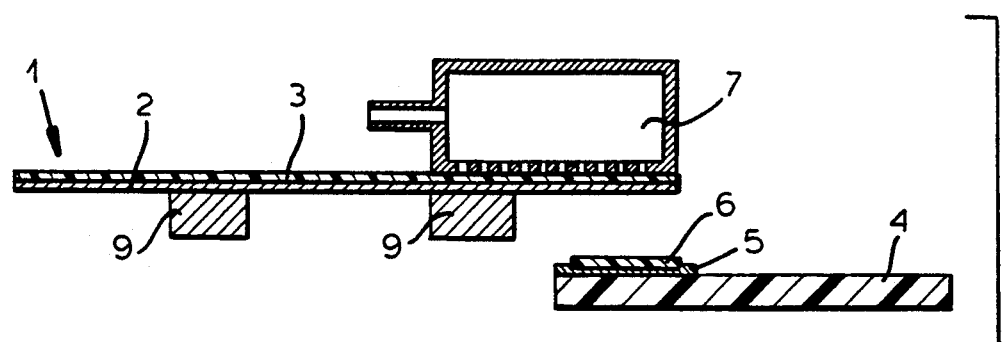
FIG. 7 is a diagrammatic view of a heating device.
Figure 9:
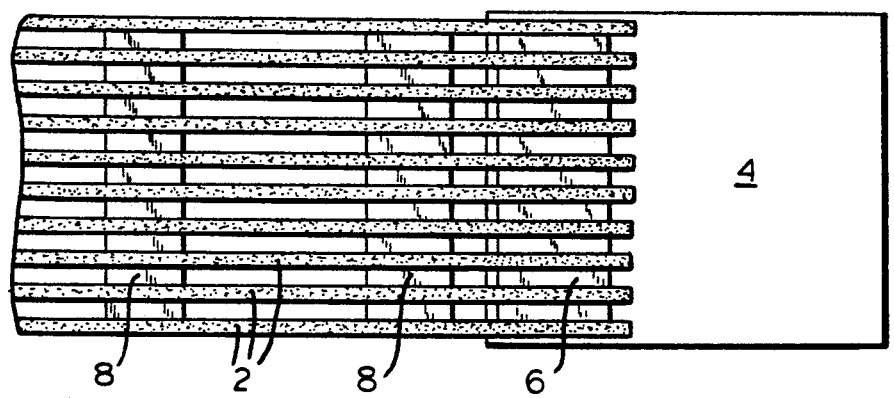
FIG. 9 is a top view of the connection.
Figure 8:
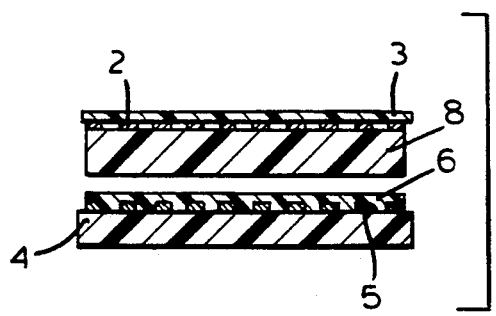
FIG. 8 is a diagrammatic view showing two pieces juxtaposed with one another.

The flexible circuit 1 is then picked up by, for example, a vacuum grasping device 7 (FIG. 7) and heated by, for example, a thermostated hot bar 8 on which the surface of the metallic strips 2 is placed at a slight distance from a contact zone of its strips before being connected to the connection elements 5. It it is possible to provide heating by other means, such as resistors, with hot air or with microwaves. The heat is transmitted by the strips 2 to the zone of these strips before being connected to the component 4. On the other hand, the strip of sheet 3, between the strips, which are thermally non-conducting, are not heated. It is subsequently possible to block the transmission of heat towards the portion of the circuit 1 opposite the zone before into connection to the component 4 by placing a cold compound on the strips of this portion.

Figure 10:
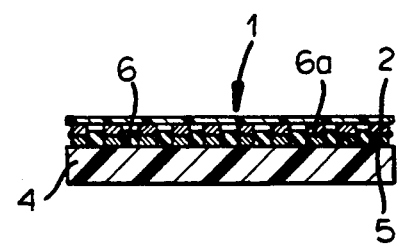
FIG. 10 is a cross-sectional view showing two pieces according to invention brought in contact.
Figure 11:
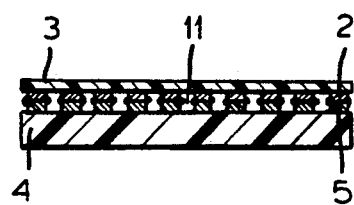
FIG. 11 is a cross-sectional view showing the connection upon removing resin from passages bridging contacts according to the invention.
Figure 12:
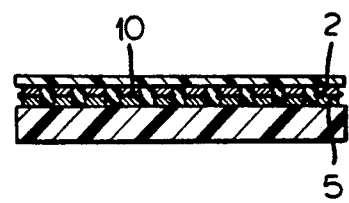
FIG. 12 is a cross-sectional view analogous to the one shown in FIG. 11 but before removal of the resin.
Figure 13:
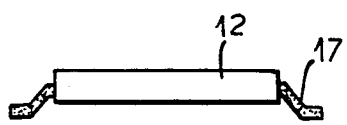
FIG. 13 is a diagrammatic side view of an electronic component according to the second embodiment of the present invention.
Figure 15:
FIG. 15 is a side view of a substrate formed with contacts.
Figure 14:
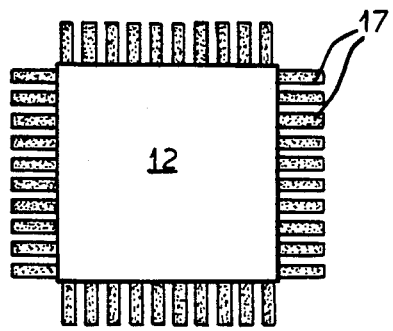
FIG. 14 is a plan diagrammatic view of the electronic component shown in FIG. 13.
Figure 16:
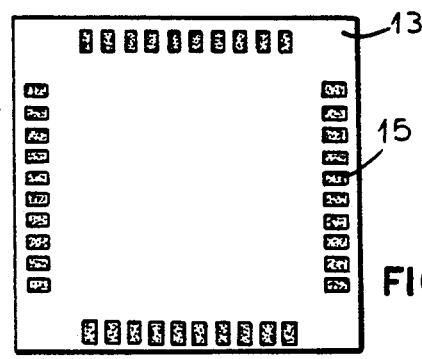
FIG. 16 is a plan view of the substrate seen in FIG. 15.
Figure 17:
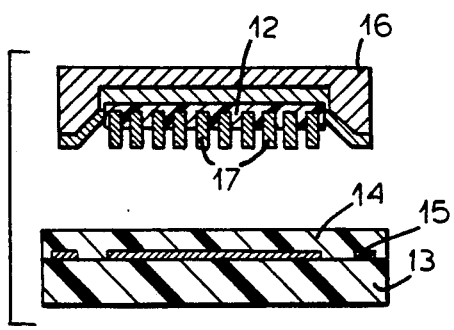
FIG. 17 is a cross sectional view of the components according to the second embodiments which are juxtaposed with one another.
Figure 18:
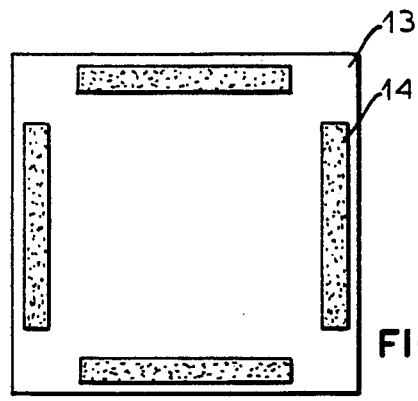
FIG. 18 is a plan view of the substrate shown in FIG. 16 with a compound put on the contacts.
Figure 19:
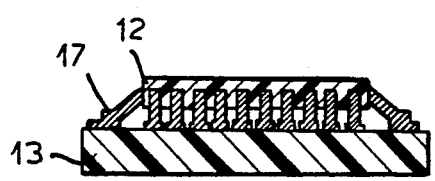
FIG. 19 is a cross sectional view of the finished product.
Figure 20:
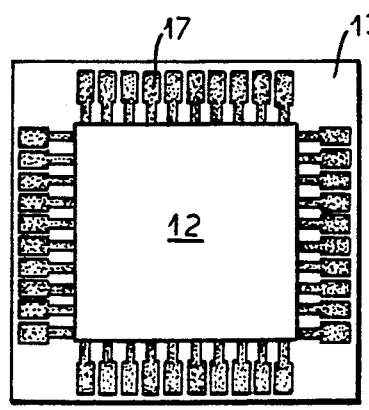
FIG. 20 is a plan view of the product shown in FIG. 19.

Then the hot strips 2 of the circuit 1 are laid on the resin 6, which in a matter of a few seconds ensures the heating and hardening of the portions of this resin in contact with these strips 2. These portions become conductive and ensure the connection of the strips 2 and the connections 5 between which they are located, as indicated at 6a(FIG. 10). On the other hand, the portions of the resin 6 occuring lying between the strips 2 remain cold and thus non-hardened and non-conducting.

It is then possible for the non-hardened resin located between the embodied connections to be removed by a solvent. So as to avoid any subsequent short-circuit I fill the formed alveoles 11 with a non-conducting resin 10, which improves the mechanical strength of the unit and the electric insulation between the contacts, protects it against any environmental corrosion and avoids any possible oxidations of the materials.

FIGS. 13 to 20 show the application of the method for the connection of an electronic component 12 to a substrate 13. The contacts 15 of the substrate 13 are coated with a thin hardenable resin film 14 which upon hardening becomes a conductor of electricity. With the aid of a heating means 16, all the electrodes 17 of the components 12 are simultaneously heated to the hardening temperature of the resin 14. When the electrodes are heated, the component 12 is placed on the resin. This resin hardens solely in the regions under the electrodes 17 and the nonhardened resin can be eliminated by washing.

It goes without saying that the present invention is not merely limited to the embodiments shown and described above, but, on the other hand, covers all possible variants. This is why it is possible to increase the heating rate of the extremities of the strips 2 by making the circuit 1 slide through the heating device, this in particular being indicated for a case of heating at a high frequency.

What is claimed is:

1. A method of making an electrical connection, comprising the steps of:
   (a) forming in a pattern a plurality of electrically conductive elements on a first piece adapted to form one another of the electrical connection;
   (b) forming in said pattern another plurality of electrically conductive elements on a second piece adapted to form a second member of said electrical connection;
   (c) applying over said pattern of the elements of said first piece a duroplastic resin hardening and becoming electrically conductive upon heating;
   (d) heating the electrically conductive elements of said second piece; and
   (e) placing the second piece against said resin with the heated electrically conductive elements of said second piece in juxtaposition with the electrically conductive elements of said first piece, thereby bonding said electrically conductive elements of said pieces together with hardened portions of the resin between the elements of the pieces rendered electrically conductive by heat from said elements of said second piece.

2. The method defined in claim 1, further comprising the step of applying a solvent to gaps formed between adjacent pairs of bonded electrically conductive elements of the pieces for removing the resin accumulated upon bonding.

3. The method defined in claim 1 wherein said step (d) includes the step of heating a predetermined contact zone.

4. The method defined in claim 3, further comprising the step of preventing heat-conducting beyond the predetermined contact zone.

5. The method defined in claim 1 wherein said first piece is flexible and made of plastic, said second piece being a component.

6. The method defined in claim 1 wherein said first piece with said electrically conductive elements is a component, said second piece being a substrate.

7. The method defined in claim 2, further comprising the step of filling said gaps with nonconducting resin.

8. The method defined in claim 1 wherein said step (d) further includes the step of sliding the second plate through a heating device.

* * * * *